US007414841B2

(12) United States Patent
Chen et al.

(10) Patent No.: US 7,414,841 B2
(45) Date of Patent: Aug. 19, 2008

(54) ELECTRONIC COOLING SYSTEM HAVING A VENTILATING DUCT

(75) Inventors: Chun-Chi Chen, Shenzhen (CN); Shih-Hsun Wung, Shenzhen (CN); Guang Yu, Shenzhen (CN); Da-Yuan Zhou, Shenzhen (CN); Jin-Biao Liu, Shenzhen (CN)

(73) Assignees: Fu Zhun Precision Industry (Shen Zhen) Co., Ltd., Longhua Town, Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 402 days.

(21) Appl. No.: 11/307,011

(22) Filed: Jan. 19, 2006

(65) Prior Publication Data
US 2007/0165374 A1 Jul. 19, 2007

(51) Int. Cl.
H05K 7/20 (2006.01)
H05K 5/00 (2006.01)
F28D 15/00 (2006.01)

(52) U.S. Cl. .............. 361/697; 361/687; 361/695; 361/704; 361/709; 361/700; 165/104.33; 165/185; 454/184

(58) Field of Classification Search ......... 361/694–695, 361/697, 699–704, 709–710, 719; 165/80.3–80.5, 165/104.33, 185; 174/15.1–15.2, 16.1, 16.3; 312/223.2, 236; 454/184
See application file for complete search history.

(56) References Cited
U.S. PATENT DOCUMENTS 5,208,730 A * 5/1993 Tracy

| 6,625,021 | B1 * | 9/2003 | Lofland et al. |
| 6,791,837 | B2 | 9/2004 | Chen et al. |
| 6,920,044 | B2 | 7/2005 | Lin |
| 6,920,045 | B2 * | 7/2005 | Huang et al. ............ 361/700 |
| 6,940,716 | B1 * | 9/2005 | Korinsky et al. |
| 6,969,234 | B2 * | 11/2005 | Lin |
| 7,035,102 | B2 * | 4/2006 | Holmes et al. |
| 7,121,327 | B2 * | 10/2006 | Chen |
| 7,126,819 | B2 * | 10/2006 | Liang |
| 7,165,604 | B2 * | 1/2007 | Huang |
| 7,174,951 | B1 * | 2/2007 | Lin |
| 7,248,476 | B2 * | 7/2007 | Holmes et al. |
| 7,269,012 | B2 * | 9/2007 | Lee et al. |

(Continued)

FOREIGN PATENT DOCUMENTS

CN 1516273 A 7/2004

*Primary Examiner*—Jayprakash N Gandhi
*Assistant Examiner*—Robert J Hoffberg
(74) *Attorney, Agent, or Firm*—Winston Hsu

(57) ABSTRACT

A heat dissipation device in a computer enclosure includes a heat spreader (20) mounted on a CPU (12), a first heat sink (30), a cooling fan (40) coupled to the first heat sink, a second heat sink (50), a heat pipe (80) mounted on the heat spreader and thermally connected the first heat sink and the second heat sink, a system fan (60) attached to the second heat sink, and a fan duct (70) interconnected between the cooling fan and the second heat sink. The system fan is positioned adjacent to louvers of the computer enclosure. An airflow generated by the cooling fan and the system fan flows through the first heat sink, then the fan duct, the second heat sink, and finally the louvers to leave the computer enclosure.

19 Claims, 2 Drawing Sheets

U.S. PATENT DOCUMENTS

| | | | |
|---|---|---|---|
| 7,286,350 B2 * | 10/2007 | Lee et al. | |
| 2005/0087329 A1 * | 4/2005 | Zhang et al. | |
| 2005/0099774 A1 * | 5/2005 | Song | 361/700 |
| 2005/0180102 A1 * | 8/2005 | Kim | 361/694 |
| 2005/0195568 A1 * | 9/2005 | Shyr | 361/695 |
| 2006/0023419 A1 * | 2/2006 | Kao et al. | 361/690 |
| 2006/0164808 A1 * | 7/2006 | Stefanoski | 361/700 |

* cited by examiner

ELECTRONIC COOLING SYSTEM HAVING A VENTILATING DUCT

FIELD OF THE INVENTION

The present invention relates to a heat dissipation device in a computer enclosure, and particularly to a heat dissipation device having a ventilating duct to guide an airflow generated by a cooling fan of the heat dissipation device out of the computer enclosure.

DESCRIPTION OF RELATED ART

Many computer electronic devices such as central processing units (CPUs) generate a lot of heat during normal operation. The heat can deteriorate the operational stability of the CPUs and damage the associated computers. Thus, the heat must be removed efficiently to ensure the normal operation. Conventionally, a heat sink is attached to a top surface of a CPU in a computer to remove heat therefrom. A cooling fan is often attached on a top of the heat sink, for generating a forced airflow through the heat sink to help a quick removal of the heat from the heat sink. A system fan is often attached on a rear panel of the computer to expel the heat dissipated from the heat sink out of the computer.

Contemporary powerful CPUs generate unprecedented amounts of heat. The above-mentioned conventional heat dissipation system is increasingly unable to meet the demanding heat-removal requirement of the contemporary CPUs. The conventional heat dissipation system generally resolves this problem by increasing the size or operating speed of the system fan, which results in both increased consumed power and increased noise level. Moreover, it is found that if an airflow generated by the system fan cannot effectively flow through the heat sink, the heat of the heat sink cannot be timely dissipated, even if the size or operating speed of the system fan is increased.

A heat dissipation device which overcomes the above-mentioned problems and shortcomings is desired.

SUMMARY OF INVENTION

According to a preferred embodiment of the present invention, a heat dissipation device in a computer enclosure comprises a heat spreader thermally connected with a CPU mounted on a printed circuit board of the computer, a first heat sink, a cooling fan coupled to the first heat sink, a second heat sink, a heat pipe mounted on the heat spreader and thermally connected the first heat sink and the second heat sink, a system fan attached to the second heat sink, and a fan duct interconnected between the cooling fan and the second heat sink, such that an airflow channel is formed between the first heat sink and the second heat sink. The heat pipe absorbs the heat of the CPU from the heat spreader and transfers the heat to both the first and second heat sinks. The cooling fan and system fan cooperatively generate a forced airflow flowing through the first heat sink, the fan duct, the second heat sink and out of the computer through the computer enclosure on which the system fan is mounted. Therefore, the heat generated by the CPU can be effectively expelled out the computer enclosure and the CPU can be effectively cooled.

Other advantages and novel features of the present invention will become more apparent from the following detailed description of preferred embodiment when taken in conjunction with the accompanying drawings, in which:

DETAILED DESCRIPTION

Figure 1:
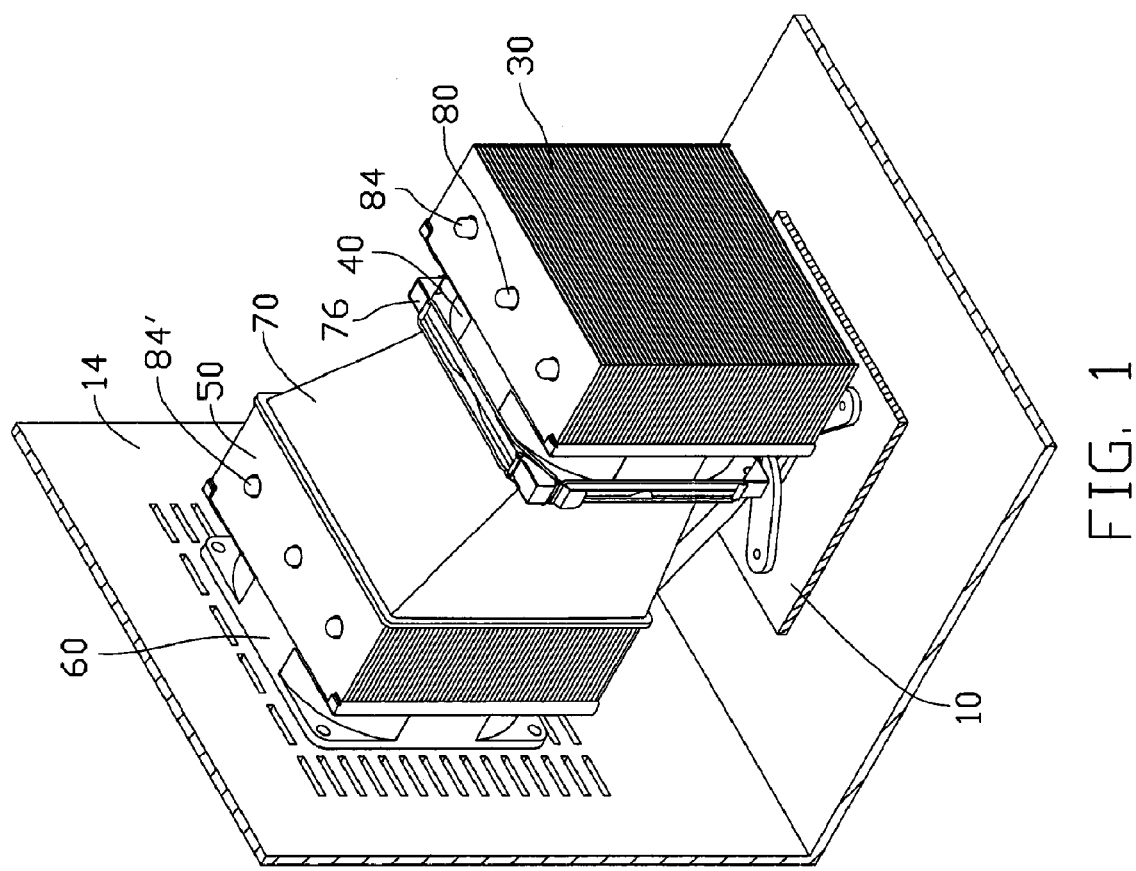
FIG. 1 is an assemble view of a heat dissipation device according to a preferred embodiment of the present invention, wherein the heat dissipation device is mounted in a computer enclosure.
Figure 2:
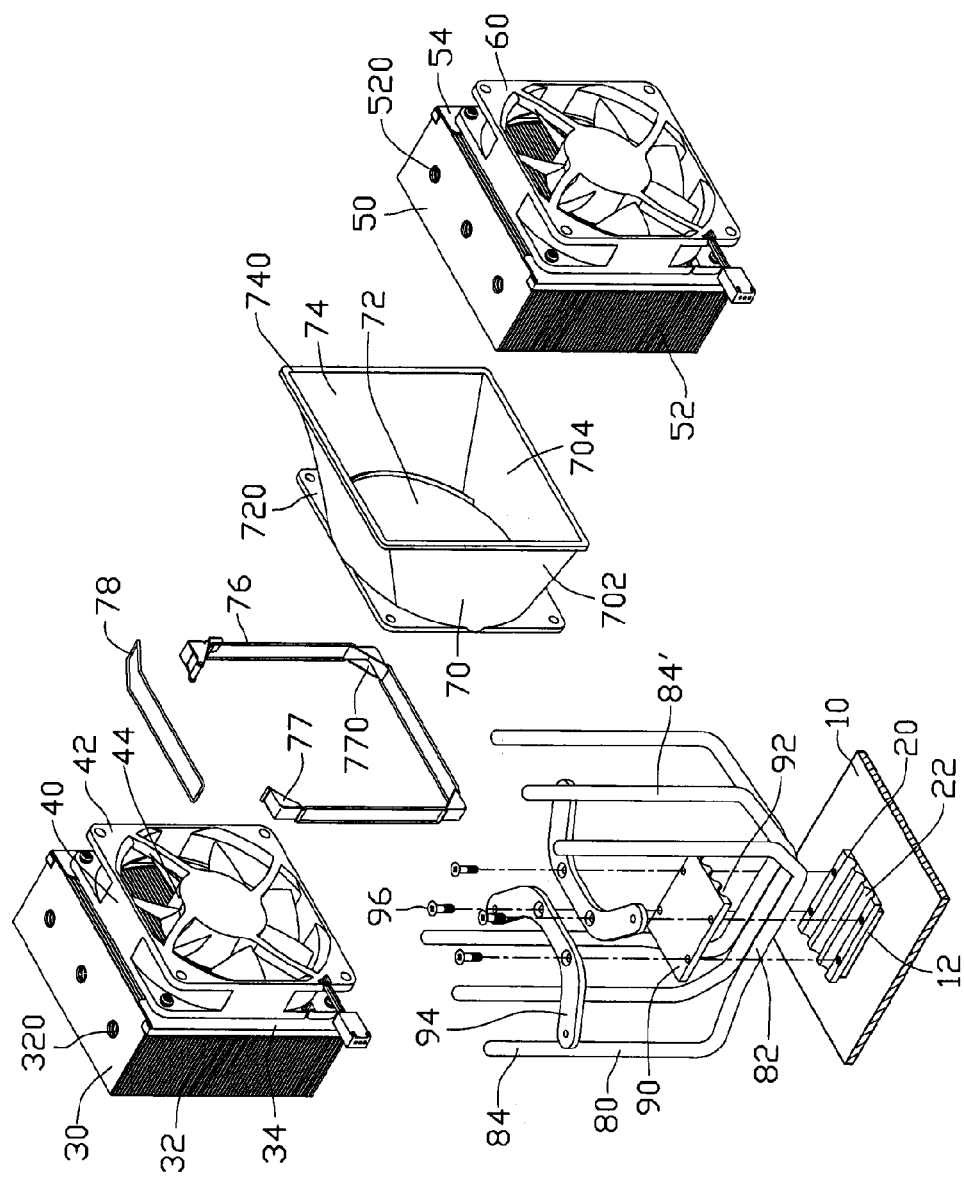
FIG. 2 is a partly exploded, isometric view of FIG. 1, from a different aspect.

FIG. 1 and FIG. 2 show a heat dissipation device of the present invention which is installed onto a printed circuit board (PCB) 10 of a computer enclosure 14 of a computer. A central processing unit (CPU) 12 is mounted on the PCB 10. The heat dissipation device comprises a heat spreader 20 attached on the CPU 12, a first heat sink 30, a cooling fan 40 coupled to the first heat sink 30, a second heat sink 50, a system fan 60 attached to the second heat sink 50, a fan duct 70 interconnected between the cooling fan 40 and the second heat sink 50, and three juxtaposed heat pipes 80 positioned on the heat spreader 20 and thermally connecting the first heat sink 30 with the second heat sink 50.

The heat spreader 20 is made of metal material such as copper or aluminum, with good heat conductivity, for absorbing heat generated by the CPU 12. The heat spreader 20 defines three slots 22 at a top portion thereof, for receiving the heat pipes 80. Each of the heat pipes 80 has a substantially U-shaped configuration. Each heat pipe 80 comprises a middle, horizontal evaporating portion 82 and a pair of vertical condensing portion 84, 84' extending from free ends of the evaporating portion 82. The evaporating portions 82 of the heat pipes 80 are soldered in the slots 22 of the heat spreader 20. A top plate 90 is mounted onto the evaporating portions 82. The top plate 90 defines three slots 92 at a bottom portion thereof, corresponding to the slots 22 of the heat spreader 20. The slots 22 of the heat spreader 20 and the slots 92 of the top plate 90 cooperatively receive the evaporating portions 82 of the heat pipes 80. A pair of fixing members 94 is fixed on the top plate 90 by extending screws 96 through the fixing members 94 and the top plate 90 to threadedly engage with the heat spreader 20. Fasteners (not shown) are used to extend through the fixing members 94 and engage with a fixture (not shown) on the PCB 10 to thereby install the heat dissipation device to the PCB 10.

The first heat sink 30 comprises a plurality of fins 32 spaced from and snapped with each other, such that channels (not labeled) are formed between neighboring fins 32. Each of the fins 32 is perforated with three through holes 320 corresponding to the condensing portions 84 of the heat pipes 80. The condensing portions 84 are soldered in the holes 320, respectively.

The cooling fan 40 is installed at one side of the first heat sink 30 via a pair of fan holders 34. The cooling fan 40 has a square configuration, and comprises a fan bracket 42 and an impeller 44 received in the fan bracket 42.

The second heat sink 50 has a similar configuration to the first heat sink 30. The second heat sink 50 comprises a plurality of fins 52. Each of the fins 52 defines three through holes 520 therein corresponding to the condensing portions 84' of the heat pipes 80. The condensing portions 84' are soldered in the holes 520, respectively.

The fan duct 70 is interconnected between the cooling fan 40 and the second heat sink 50. The fan duct 70 has an inlet portion 72 facing the cooling fan 40, and an outlet portion 74 facing the second heat sink 50. The outlet portion 74 has a greater cross sectional area than the inlet portion 72. The fan duct 70 comprises a periphery wall 702 and a channel 704 enclosed by the wall 702. A size of the channel 704 is gradually increased from the inlet portion 72 to the outlet portion 74. The fan duct 70 further comprises a flat flange 720 extending outwardly from an edge of the inlet portion 72, and a lateral flange 740 extending outwardly from an edge of the outlet portion 74. The flat flange 720 is square, corresponding to the fan bracket 42 of the cooling fan 40. A mounting bracket 76 interconnects the fan bracket 42 and the flat flange 720, for fixing the fan duct 70 to the cooling fan 40. The mounting bracket 76 has a square configuration, and comprises four hollow rectangle frames 78. Each frame 78 has a pair of opposite shorter sides (not labeled) and a pair of opposite longer sides (not labeled). A block 77 connects two adjacent shorter sides of the two adjacent frames 78. The block 77 has a triangle configuration, and defines a receiving room 770 for clamping and receiving one of four corners of the fan bracket 42 and the flat flange 720 of the inlet portion 72 of the fan duct 70. Four edges of a side of the second heat sink 50 facing the fan duct 70 are received in the channel 704 of the fan duct 70 adjacent to the outlet portion 74 thereof. The lateral flange 740 of the fan duct 70 is used for hermetically clamping the four edges of the side of the second heat sink 50.

The system fan 60 has a similar configuration to the cooling fan 40. The system fan 60 is attached on an inside of the computer enclosure 14 and in communication with an outside of the computer via louvers (not labeled) in the computer enclosure 14. The system fan 60 is installed at another side of the second heat sink 50, opposite to the fan duct 70, via a pair of fan holders 54 similar to the fan holders 34. The system fan 60 and the cooling fan 40 are used for generating an airflow effectively expelling heat of the CPU 12 out of the computer.

When the CPU 12 starts operating, the heat generated thereby is transferred by the heat pipes 80 to the first heat sink 30 and the second heat sink 50. The airflow generated by the cooling fan 40 and the system fan 60 first draws the heat from the fins 32 of the first heat sink 30 into the fan duct 70. Then the airflow flows through the fins 52 of the second heat sink 50 to take the heat away therefrom. Finally, the airflow flows out of the computer through the louvers in the computer enclosure 14 to expel the heat out of the computer. The fan duct 70 hermetically interconnects the cooling fan 40 and the second heat sink 50, such that the channel 704 is hermetically formed between the first heat sink 30 and the second heat sink 50. The fan duct 70 ensures that the airflow directly flows through the first and second heat sinks 30, 50 before it is expelled from the enclosure 14 to an outside of the computer. Therefore, the heat generated by the CPU 12 can be effectively expelled from the computer enclosure 14 by the system fan 60 and the cooling fan 30. A very small portion of the heat generated by the CPU 12 is radiated to an ambient air in the computer enclosure 14. Thus, the temperature of the ambient air in the computer can be kept low, whereby the computer can operate stably and normally even after a long period of use.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device, comprising:
   a heat spreader mounted on an electrical component;
   a first heat sink;
   a first fan coupled to the first heat sink for facilitating to dissipate heat from the first heat sink;
   a second heat sink;
   a second fan coupled to the second heat sink and located adjacent to a computer enclosure;
   a heat pipe mounted on the heat spreader and thermally connected the first heat sink and the second heat sink; and
   a fan duct interconnected between the first fan and the second heat sink, an airflow generated by the first fan and the second fan flowing through the first heat sink, entering the fan duct, flowing through the second heat sink, and finally flowing out of the computer enclosure.

2. The heat dissipation device as described in claim 1, wherein the fan duct comprises a hollow wall and a channel enclosed by the wall.

3. The heat dissipation device as described in claim 2, wherein the fan duct has an inlet portion faced to the first fan and an outlet portion faced to the second heat sink.

4. The heat dissipation device as described in claim 3, wherein the outlet portion has a greater cross sectional area than the inlet portion.

5. The heat dissipation device as described in claim 3, wherein the fan duct comprises a flat flange extending outwardly from an edge of the inlet portion, and a lateral flange extending outwardly from an edge of the outlet portion.

6. The heat dissipation device as described in claim 5, wherein the first fan comprises a square fan bracket corresponding to the flat flange, and an impeller received in the fan bracket.

7. The heat dissipation device as described in claim 6, wherein the flat flange of the fan duct is connected with the fan bracket via a mounting bracket.

8. The heat dissipation device as described in claim 7, wherein the mounting bracket comprises hollow rectangle frames, each frame has a pair of opposite shorter sides and a pair of opposite longer sides.

9. The heat dissipation device as described in claim 8, wherein a block connects two adjacent shorter sides of two adjacent frames.

10. The heat dissipation device as described in claim 9, wherein the block has a triangle configuration, and comprises a receiving room for clamping and receiving one of four corners of the fan bracket and the flat flange of the inlet portion of the fan duct.

11. The heat dissipation device as described in claim 6, wherein the second heat sink comprises a plurality of fins, edges of a side the second heat sink facing the fan duct are received in the channel adjacent to the outlet portion of the fan duct and the lateral flanges of the fan duct clamp the edges of the side of the second heat sink.

12. The heat dissipation device as described in claim 1, wherein the heat pipe comprises a horizontal evaporating portion and a pair of vertical condensing portions.

13. The heat dissipation device as described in claim 12, wherein the first heat sink comprises a plurality of fins, each of the fins is perforated with a through hole receiving one of the condensing portions of the heat pipe.

14. The heat dissipation device as described in claim 11, wherein second heat sink comprises a plurality of fins, each of the fins of the second heat sink is perforated with a through hole receiving the other condensing portion of the heat pipe.

15. A heat dissipation device comprising:
a first heat sink having a plurality of fins;
a first fan attached to a side of the first heat sink;
a second heat sink having a plurality of fins;
a second fan attached to a side of the second heat sink; and
a fan duct interconnecting the first fan and the second heat sink, comprising an inlet portion facing the first fan and an outlet portion facing the second heat sink.

16. The heat dissipation device as described in claim 15, further comprising a heat pipe having an evaporating portion and a pair of condensing portions thermally connecting with the first and second heat sinks, respectively.

17. The heat dissipation device as described in claim 16, wherein one of the condensing portions of the heat pipe extends through the fins of the first heat sink and the other condensing portion of the heat pipe extends through the fins of the second heat sink.

18. A computer system comprising: an enclosure defining a plurality of louvers; a printed circuit board received in the enclosure; a heat-generating electronic component mounted on the printed circuit board; a heat pipe having an evaporating portion thermally connecting with the electronic component and first and second condensing portions; a first heat sink thermally connecting with the first condensing portion; a first fan positioned adjacent to the first heat sink; a second heat sink thermally connecting with the second condensing portion; a second fan positioned adjacent to the second heat sink; and a fan duct interconnecting between the first fan and the second heat sink, an airflow generated by the first fan and the second fan flowing through the first heat sink, then the fan duct, the second heat sink and finally the louvers of the computer enclosure to leave the computer system.

19. The computer system as described in claim 18, wherein the second fan is located adjacent to the louvers of the computer enclosure.

* * * * *